United States Patent
Day et al.

(10) Patent No.: US 8,143,074 B2
(45) Date of Patent: Mar. 27, 2012

(54) SEMICONDUCTOR PROCESSING SYSTEM AND METHOD OF PROCESSING A SEMICONDUCTOR WAFER

(75) Inventors: Robert M. Day, Austin, TX (US); Paul E. Lopez, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 584 days.

(21) Appl. No.: 11/941,564

(22) Filed: Nov. 16, 2007

(65) Prior Publication Data

US 2009/0130780 A1     May 21, 2009

(51) Int. Cl.
*H01L 21/00* (2006.01)
(52) U.S. Cl. .............. 438/5; 438/712; 257/E21.528; 118/730
(58) Field of Classification Search .............. 438/5, 706, 438/709, 708, 712; 257/E21.528; 137/88–93
See application file for complete search history.

(56) References Cited

U.S. PATENT DOCUMENTS

| | | | |
|---|---|---|---|
| 4,834,020 A | 5/1989 | Bartholomew et al. | |
| 4,993,358 A | 2/1991 | Mahawili | |
| 5,136,975 A | 8/1992 | Bartholomew et al. | |
| 5,580,421 A * | 12/1996 | Hiatt et al. | 438/708 |
| 5,800,792 A * | 9/1998 | Ibaraki et al. | 423/210 |
| 6,156,151 A * | 12/2000 | Komino et al. | 156/345.29 |
| 7,775,236 B2 * | 8/2010 | Gold et al. | 137/487.5 |
| 2006/0065636 A1 * | 3/2006 | Babic | 216/93 |
| 2008/0000497 A1 * | 1/2008 | Verhaverbeke | 134/1.1 |
| 2008/0069702 A1 * | 3/2008 | Okabe et al. | 417/65 |
| 2009/0101173 A1 * | 4/2009 | Peng et al. | 134/18 |

* cited by examiner

*Primary Examiner* — William D Coleman
*Assistant Examiner* — Wilner Jean Baptiste
(74) *Attorney, Agent, or Firm* — James L. Clingan, Jr.

(57) ABSTRACT

A method of processing semiconductor wafers includes applying reactive gas through a plurality of inlets to the semiconductor wafers. The method further includes removing exhaust gas resulting from the step of applying reactive gas. The removing of the exhaust gas is through a plurality of outlets coupled to a manifold. The manifold combines the exhaust gas from the plurality of outlets. The method further includes measuring a pressure in each outlet of the plurality of outlets during the step of removing.

9 Claims, 2 Drawing Sheets

SEMICONDUCTOR PROCESSING SYSTEM AND METHOD OF PROCESSING A SEMICONDUCTOR WAFER

BACKGROUND

1. Field

This disclosure relates generally to manufacturing semiconductor wafers and more specifically, to manufacturing semiconductor wafers using systems having exhaust gases.

2. Related Art

When performing atmospheric pressure chemical vapor deposition (APCVD), byproducts from the chemical reaction may undesirably deposit on parts of the tool. These byproducts may fall onto the semiconductor wafer being processed and create dusting. The dusting effect decreases yield. Because any dusting is not detected until entire lots of wafers (e.g., 25 wafers per lot) are processed, the entire lots needs to be scrapped. Since APCVD is used typically to form inter-level dielectric layers (ILD), the lots have already undergone significant processing. Thus, scrapping wafers after APCVD wastes the time and money spent processing the wafers to this point. Furthermore, once it is determined that dusting has occurred, the tool must be taken out of production so that the cause of the dusting can be determined. The search for the cause and cleaning the tool may be time-consuming, which further decreases yield. Therefore, a need exists to decrease the negative impacts of dusting that occur during semiconductor manufacturing, such as when using APCVD.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, during semiconductor manufacturing, a reactive gas is applied to semiconductor wafers to form a layer, such as a dielectric layer, on each of the semiconductor wafers. The byproducts of the reaction form a leftover or exhaust gas that travels out of the tool through outlets. The pressure in each outlet is monitored and measured while the leftover gas or exhaust gas travels out of the outlet. By measuring the pressure of the exhaust or leftover gas in the outlet allows for advanced warning or notification of a potential failure of the process that may undesirably result in particle formation (e.g., dusting) on the wafers. If the pressure is undesirable a warning can be sent to avoid damaging wafers. While the exhaust gases from each outlet may be combined in a manifold and the pressure of the combined exhaust gas can be measured, this measurement does not result in a warning system. This is because the inventors have determined that the cause of the dusting is due to a change in pressure of the gas in the outlet not in the manifold.

Figure 1:
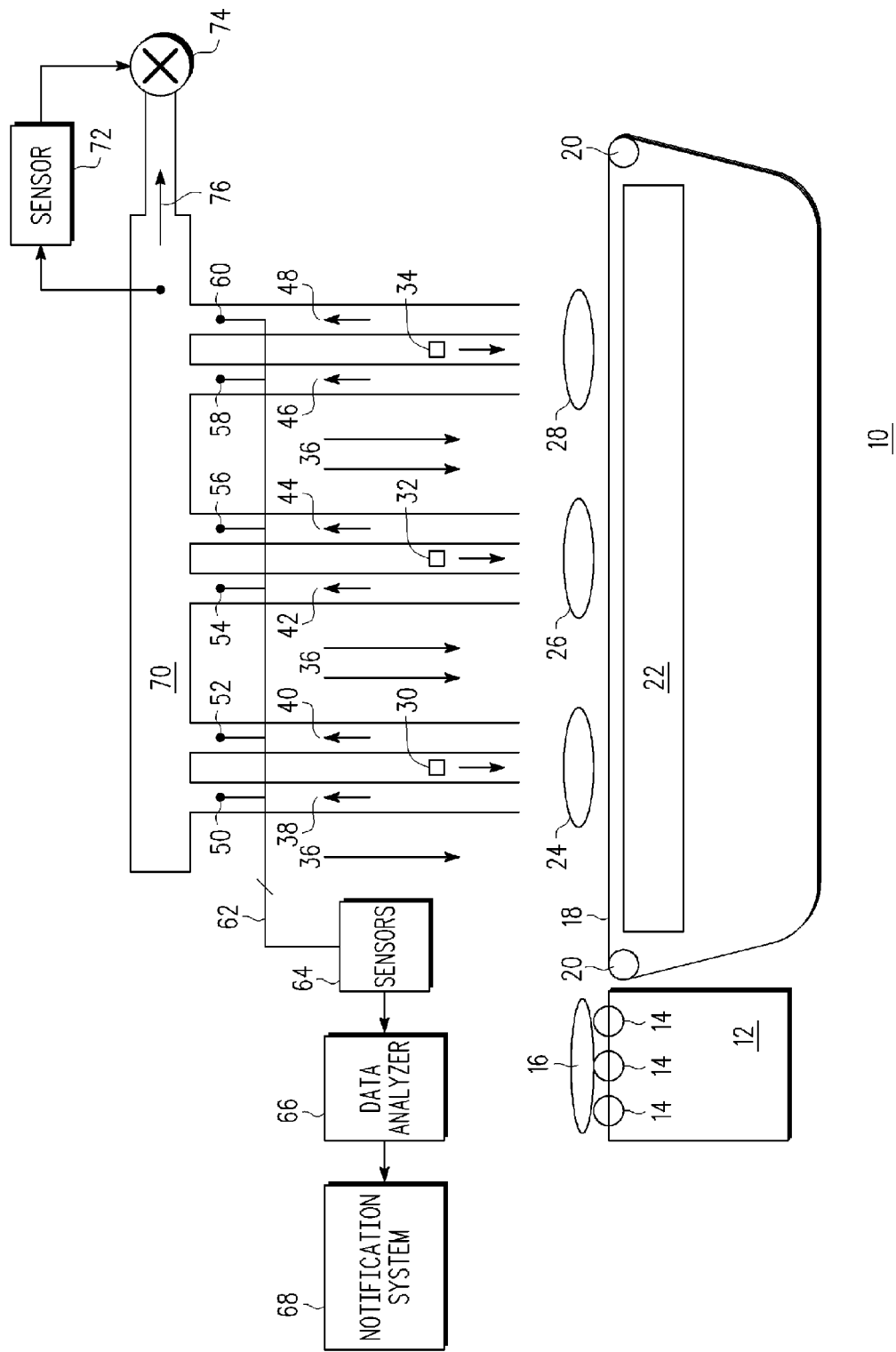
FIG. 1 illustrates a schematic of a semiconductor processing system in accordance with one embodiment.

FIG. 1 illustrates a semiconductor processing system 10 in accordance with one embodiment. In one embodiment, the semiconductor processing system 10 is an APCVD system. In one embodiment, the semiconductor processing system 10 is an APCVD reactor sold by Watkins-Johnson. However, the semiconductor processing system can be any system used to manufacture semiconductor wafers and that has exhaust or leftover gas, such as another type of deposition system.

In the embodiment illustrated in FIG. 1, the semiconductor processing system 10 includes a load shuttle 12 having rollers 14 that are used to transport a semiconductor wafer 16 to a belt 18, which may be called a process belt. The belt 18 is a support means for the wafers. However, the support means can be another structure that supports the wafer. For example, the support means can be a (metal) plate or tray (which may or may not include a method for allowing the wafers to stay on the plate through suction), a heat source, a robotic arm, and rollers. The wafer 16 is a semiconductor wafer and can be any semiconductor material or combinations of materials, such as gallium arsenide, silicon germanium, silicon-on-insulator (SOI), silicon, monocrystalline silicon, the like, and combinations of the above. Furthermore, the wafer 16 may have structures formed on it from previous manufacturing (e.g., control electrodes, dielectrics, dopant regions, conductive layers, etc.). In one embodiment, under the belt 18 is a heat source that keeps the wafers on the belt 18 at a predetermined temperature or within a predetermined range of temperatures. The load shuttle 12 may receive the wafer 16 from a robotic arm (not shown) that delivers the wafer 16 to the load shuttle 12 from the wafer cassette (not shown), which is where the wafer is stored. Once a wafer is transferred to the belt 18, which moves due to rollers 20, it travels along the belt 18 to be processed, as will be better understood after further discussion.

The system includes three inlets 30, 32, and 34, which is where the processing gases (reactive gas) enter the system 10. More specifically, in the embodiment illustrated, inlets 30, 32, and 34 are injectors. A material is deposited on wafers 24, 26, and 28 as they travel along the belt 18 and pass under the inlets 30, 32, and 34. A gas curtain 36 may be present in the system 10 to keep the processing gases from reacting in an undesirable manner. In one embodiment, the reactive gas includes silane and oxygen. For example if the processing gas includes silane, the gas curtain 36 may be nitrogen to prevent the silane from reacting with any oxygen that is not purposely added to the processing. Since the system 10 may be operating at a temperature of approximately 430 degrees Celsius the silane may burn if exposed to oxygen.

The byproducts of the deposition process leave the system 10 through outlets 38, 40, 42, 44, 46, and 48. In the embodiment illustrated, each inlet 30, 32, and 34 has an associated pair of outlets 38, 40, 42, 44, 46, and 48. More specifically, the outlets 38, 40, 42, 44, 46, and 48, in one embodiment, are exhaust lines. In one embodiment, a manifold 70 is coupled to the outlets 38, 40, 42, 44, 46, and 48. The exhaust gases from the outlets 38, 40, 42, 44, 46, and 48 combine in the manifold 70 to form the exhaust gas 76. Sensor 72 monitors the pressure of the exhaust gas 76 and a throttle valve 74 is present to adjust the pressure as needed. Sensor 72 can be any sensor means. For example, sensor 72 can be any type of sensor such as an absolute pressure sensor, a gauge pressure sensor, a vacuum pressure sensor, differential pressure sensor, or combinations of the above. Furthermore, different technologies can be used to make the sensor 72, such as fiber optics, mechanical deflection, strain gauge, semiconductor piezoresistive technology, microelectromechanical systems (MEMS), vibrating elements, variable capacitance, or combinations of the above. It is desirable that the exhaust gas 76 has a pressure of approximately 1.3 inches of water. Since the exhaust gas is the combined pressure of the exhaust gases leaving the outlets 38, 40, 42, 44, 46, and 48, different combinations of pressure in the outlets 38, 40, 42, 44, 46, and 48 can exist. For example, one outlet's pressure can increase while another outlet's pressure decreases. The Watkins-Johnson APCVD system is set up, however, to measure of the (combined) exhaust gas 76 pressure only. This approach assumes that the pressure in the outlets 38, 40, 42, 44, 46, and 48 is always the same. This is a logical assumption because each outlet 38, 40, 42, 44, 46, and 48 is subjected to the same processing conditions and is identical in structure to the others. The inventors have determined, however, that each gap 82 and 86 can clog at a different rate and thus, not all of the pressures of the outlets 38, 40, 42, 44, 46, and 48 are the same. Therefore, the inventors have added additional monitoring to determine the pressure in each outlet 38, 40, 42, 44, 46, and 48 or to compare the pressures in the outlets 38, 40, 42, 44, 46, and 48 to each other. When the pressure in each outlet 38, 40, 42, 44, 46, and 48 or the relative pressure of an outlet 38, 40, 42, 44, 46, and 48 is outside a predetermined limit, the system 10 can be stopped (either automatically or manually) so dusting can be minimized or even prevented. It is desirable that when stopping the system 10, any wafers in the system 10 (e.g., wafers 24, 26, and 28) finish processing. The predetermined limit for stopping the system can be set so that any wafers in the system that need to finish processing are unlikely to be damaged.

As illustrated in FIG. 1, ports 50, 52, 54, 56, and 60 exist in each outlet 38, 40, 42, 44, 46, and 48, respectively. The ports 50, 52, 54, 56, and 60 are coupled to tube lines 62. The tube lines 62 are coupled to a sensor 64, which in one embodiment includes a sensor for each outlet 38, 40, 42, 44, 46, and 48. Thus, in the embodiment illustrated the sensors 64 are six sensors. The sensors 64 can be can be any sensor means. For example, sensor 72 can be any type of sensor such as an absolute pressure sensor, a gauge pressure sensor, a vacuum pressure sensor, differential pressure sensor, or combinations of the above. Furthermore, different technologies can be used to make the sensor 72, such as fiber optics, mechanical deflection, strain gauge, semiconductor piezoresistive technology, microelectromechanical systems (MEMS), vibrating elements, variable capacitance, or combinations of the above. Furthermore, each sensor needs not be the same as the others. In one embodiment, each sensor 64 is an accurate sensor so it can monitor pressures between 200 mTorr above atmosphere and 200 mTorr below atmosphere (+/−200 mTorr from atmosphere). Through the tube lines 62, the sensors 64 sense the pressure of the gas at each port 50, 52, 54, 56, and 60. The sensor 64 senses or collects the pressures for each of the outlets 38, 40, 42, 44, 46, and 48. The sensor 64 is coupled to a data analyzer 66, which analyzes the pressures for each outlet 38, 40, 42, 44, 46, and 48.

The analyzer 66 can function in many different ways. In one embodiment, the analyzer 66 determines if and when any of the outlets 38, 40, 42, 44, 46, and 48 have a pressure that is out of a predetermined window or range of pressures. When the pressure of one (or more) of the outlets 38, 40, 42, 44, 46, and 48 is out of the range of pressures, a (fail) signal is sent to the notification system 68, to which the data analyzer 66 is coupled. In one embodiment, the range can be bounded on one end (e.g., greater than, greater than or equal to, less than, or less than or equal to a number). For example, the range of pressures may be greater than approximately 4 mTorr.

In another embodiment, the analyzer 66 compares the pressure of one or multiple outlets 38, 40, 42, 44, 46, and 48 to another outlet 38, 40, 42, 44, 46, and 48 or multiple outlets 38, 40, 42, 44, 46, and 48. If the difference between the outlets 38, 40, 42, 44, 46, and 48 is out of a predetermined window, a (fail) signal is sent to the notification system 68. In one embodiment, the highest pressure of the outlets 38, 40, 42, 44, 46, and 48 and the lowest pressure of the outlets 38, 40, 42, 44, 46, and 48 are determined. A signal is generated if the highest pressure exceeds the lowest pressure by a predetermined amount.

The notification system 68 can be any desired system, such as a light, an audio alarm, a display screen, a change in a display screen (e.g., the name of the tool being highlighted in red or the like), a page sent to a predetermined person or persons, the like, and combinations of the above. In one embodiment, the notification system 68 is combined with the data analyzer 66. In one embodiment, the notification system 68 is not present. For example, in one embodiment the fail signal can be sent directly to the semiconductor processing system 10 and the semiconductor processing system 10 may stop loading wafers and stop processing after it completes processing any wafers that have had processing started.

Figure 2:
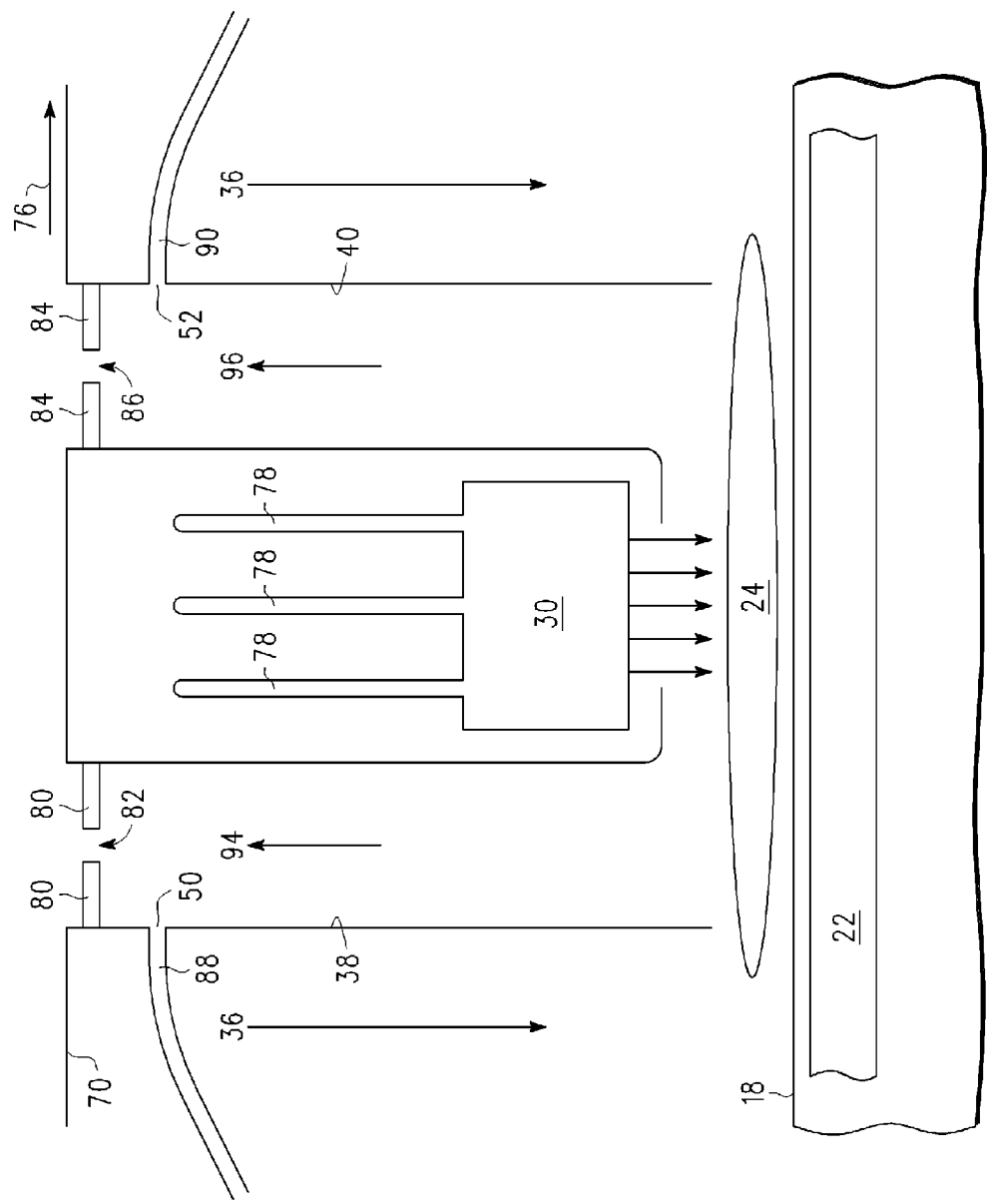
FIG. 2 illustrates a schematic of a more detailed view of a portion of the semiconductor processing system of FIG. 1 in accordance with one embodiment.

FIG. 2 illustrates a schematic of a more detailed view of a portion of the semiconductor processing system 10 illustrated in FIG. 1 in accordance with one embodiment. More specifically, the area of the semiconductor processing system 10 that includes the outlets 38 and 40 and the inlets 30 is shown in more detail. The same reference numbers are used in the figures to point to the same elements.

In FIG. 2, processing gas enters the injector 30 through the reactive gas lines 78, which are coupled to processing gas or reactive gas sources (not shown). In the embodiment illustrated, there are three reactive gas lines 78 for the injector 30; any number of reactive gas lines 78 may be present. The gas exits the injector 30 and reacts to form a chemical that is deposited on the wafer 24 that is under the injector 30. As discussed above, the wafer 24 travels through the system 10 via the belt 18, which is over the heat source 22. In addition, as previously discussed, a gas curtain 36 is present. In one embodiment, the gas curtain 36 is nitrogen. Although not illustrated, nitrogen or another gas may be entering the system through additional locations, such as in areas located in or near the openings of the outlets 38 and 40 that are closest to the wafer 24.

Any byproducts of the reaction are pulled up through the outlets 38 and 40, as exhaust gases 94 and 96, respectively. Orifice assemblies 80 and 84 each having a gap 82 and 86, respectively, are located in the outlets 38 and 40, respectively. As illustrated, the orifice assemblies 80 and 84, respectively, are located at the end of the outlets 38 and 40, respectively, which are connected to the manifold 70. The exhaust gases 94 and 96 leave the outlets 38 and 40, respectively, through the gaps 82 and 86, respectively. During processing, the gaps 82 and 86 may decrease in size. When this occurs pressure increases within the outlet where the gap decreased in size. While the tool may be designed to clean the gaps during processing (for example, by a spring that rotates), the cleaning may not remove enough of the buildup of byproducts. The inventors have found that having only a small amount of build up (i.e., decreasing the gap diameter by 0.010 inches) can be problematic. For example, the gap 86 may decrease in size and pressure of the exhaust gas 96 increases. Since the process is optimized for a certain number of outlets, if the gap 82 or 86 significantly decreases, the amount of the exhaust gas 96 that can leave (this significant decrease can occur with only a 0.010 inch decrease in the diameter of the gap), the process will not yield the desired result. In other words, the gaps in the outlets 38, 40, 42, 44, 46, and 48 are not redundant and instead the process is designed so that all the gaps in the outlets 38, 40, 42, 44, 46, and 48 are working sufficiently.

When the gap 86 decreased in size, the pressure in one of the outlet 40 is out of a desired range or its pressure when compared to another outlet (or outlets) is out of a desired range. In other words, if the gap 86 decreases too much (e.g., by 0.010 inches or more), dusting may occur. The pressure is sensed as discussed above. Each outlet 38 and 40 has its own tube line 88 and 90 respectively, which is coupled to the sensors 64. Although the sensors 64 are illustrated as coupled to ports 50 and 52 via tube lines 88 and 90, respectively, that are under the gaps 82 and 86, the ports 50 and 52 can be at any desired location.

Although the pressure may change in the outlets 38, 40, 42, 44, 46, and 48 if the gaps 82 or 86 decrease too much in size (e.g., by 0.010 inches or more), there are also other reasons the pressure may change. These other reasons may not be detected by the sensor 72 and may cause dusting or other problems. For example, a door to the system 10 may be left open, the tool may not have been properly put back together so that there is an opening somewhere, the like, or combinations of the above. Furthermore, although as discussed above, the pressure in the outlet increases when a problem occurs, the pressure can also decrease. In addition, the change (increase or decrease) can be compared to the original pressure in the outlet, a predetermined pressure, to the pressure in other outlets, the like, or combinations of the above.

By now it should be appreciated that there has been provided a method of manufacturing semiconductor wafers, especially for APCVD, that minimizes or prevents dusting that results in scrapping of product. Sensors are used to monitor the pressure within each outlet. When the pressure within at least one outlet is outside a control limit additional process may be stopped (e.g., automatically or manually.) In one embodiment, when the pressure is outside the control limit, the process may not be terminated because a decision may be made to continue processing. (In addition, even if the process is stopped the wafers already being processed may finish being processed as they may not have to be scrapped.) As discussed above, the control limit can be based on an actual measured pressure or a comparison of the measured pressure of one outlet compared to other outlets.

1. A method of processing semiconductor wafers, comprising: applying reactive gas through a plurality of inlets to the semiconductor wafers; removing exhaust gas resulting from the step of applying reactive gas, wherein the removing is through a plurality of outlets coupled to a manifold, wherein the manifold combines the exhaust gas from the plurality of outlets; and measuring a pressure in each outlet of the plurality of outlets during the step of removing. 2. The method of item 1, further comprising determining if the pressure in any of the plurality of outlets is outside of a predetermined range; and generating a signal if the step of determining determines that the pressure in any of the plurality of outlets is outside of the predetermined range. 3. The method of item 2, further comprising preventing additional semiconductor wafers from receiving the step of applying reactive gas in response to the signal being generated. 4. The method of item 1, further comprising determining a highest pressure and a lowest pressure among the plurality of outlets; and generating a signal if the highest pressure exceeds the lowest pressure by a predetermined amount. 5. The method of item 1, further comprising applying a curtain gas to the semiconductor wafers during the step of applying reactive gas. 6. The method of item 5, wherein the curtain gas comprising nitrogen. 7. The method of item 6, wherein the reactive gas comprising silane and oxygen. 8. The method of item 1, wherein the step of removing exhaust gas is further characterized by there being a pair of outlets of the plurality of outlets for each inlet of plurality of inlets. 9. The method of item 1, further comprising: moving the semiconductor wafers laterally under the plurality of inlets and the plurality of outlets during the steps of applying and removing. 10. The method of item 1, further comprising measuring a pressure in the manifold.

11. A semiconductor processing system, comprising: support means for supporting a plurality of wafers; a plurality of inlets that apply gas to the plurality of wafers; a plurality of outlets that remove gas from over the plurality of wafers, wherein each outlet of the plurality of outlets has a port; a manifold that is coupled to the plurality of outlets; and a sensor coupled to each port that determines a pressure present in each outlet of the plurality of outlets. 12. The semiconductor system of item 11, sensing means coupled to the manifold for measuring a pressure in the manifold. 13. The semiconductor system of item 11, wherein the support means moves semiconductor wafers under the plurality of inlets and outlets. 14. The semiconductor system of item 11, further comprising a data analyzer coupled to the sensor that provides a signal if any outlet of the plurality of outlets is outside a predetermined range. 15. The semiconductor system of item 11, further comprising a data analyzer coupled to the sensor, wherein the data analyzer determines if a difference between a lowest pressure and a highest pressure exceeds a predetermined amount.

16. A method of operating a semiconductor system having a plurality of inlets, a plurality of outlets, and a belt for transporting semiconductor wafers under the plurality inlets and the plurality of outlets, comprising: placing a plurality of semiconductor wafers on the belt; moving the belt to transport the semiconductor wafers; applying a reactive gas through the plurality of inlets to the semiconductor wafers; removing leftover gas through the plurality of outlets; combining the leftover gas flowed through the plurality of outlets to form an exhaust gas; and monitoring a pressure in each of the outlets during the step of removing. 17. The method of item 16, wherein the step of combining is further characterized by using a manifold to perform the combining, further comprising: measuring a pressure in the manifold. 18. The method of item 16, wherein the step of applying a reactive gas is further characterized by the reactive gas comprising silane and oxygen. 19. The method of item 16, further comprising: providing a signal if the pressure of any outlet of the plurality of outlets is outside a predetermined range. 20. The method of item 16, further comprising: providing a signal if a difference between a lowest pressure and a highest pressure among the plurality of outlets exceeds a predetermined amount.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A method of processing semiconductor wafers, comprising:
applying reactive gas through a plurality of inlets to the semiconductor wafers;
reacting the reactive gas with at least one of the semiconductor wafers;
removing exhaust gas resulting from the step of reacting the reactive gas, wherein the removing is through a plurality of outlets coupled to a manifold, wherein the manifold combines the exhaust gas from the plurality of outlets; and
measuring a pressure in each outlet of the plurality of outlets during the step of removing;
determining a highest pressure and a lowest pressure among the plurality of outlets; and
generating a signal if the highest pressure exceeds the lowest pressure by a predetermined amount.

2. The method of claim 1, further comprising:
determining if the pressure in any of the plurality of outlets is outside of a predetermined range; and
generating a signal if the step of determining determines that the pressure in any of the plurality of outlets is outside of the predetermined range.

3. The method of claim 2, further comprising:
preventing additional semiconductor wafers from receiving the step of applying reactive gas in response to the signal being generated.

4. The method of claim 1, further comprising:
applying a curtain gas to the semiconductor wafers during the step of applying reactive gas.

5. The method of claim 4, wherein the curtain gas comprises nitrogen.

6. The method of claim 5, wherein the reactive gas comprises silane and oxygen.

7. The method of claim 1, wherein the step of removing exhaust gas is further characterized by there being a pair of outlets of the plurality of outlets for each inlet of plurality of inlets.

8. The method of claim 1, further comprising:
moving the semiconductor wafers laterally under the plurality of inlets and the plurality of outlets during the steps of applying and removing.

9. The method of claim 1, further comprising measuring a pressure in the manifold.

* * * * *